United States Patent
Ikeda et al.

(10) Patent No.: US 6,966,704 B2
(45) Date of Patent: Nov. 22, 2005

(54) PUMP LIGHT SOURCE FOR RAMAN AMPLIFICATION

(75) Inventors: Masami Ikeda, Tokyo (JP); Shigeyuki Furuta, Tokyo (JP); Koichi Murata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 187 days.

(21) Appl. No.: 10/098,129

(22) Filed: Mar. 15, 2002

(65) Prior Publication Data

US 2003/0142924 A1   Jul. 31, 2003

(30) Foreign Application Priority Data

Jan. 31, 2002  (JP)  .............................. 2002-023311

(51) Int. Cl.[7] .............................................. G02B 6/36
(52) U.S. Cl. ...................................... 385/88; 359/122
(58) Field of Search ............................. 385/31, 47, 49, 385/24, 27, 11, 37, 88; 359/122, 333, 154, 359/341, 134, 160, 161, 337, 618, 629, 627

(56) References Cited

U.S. PATENT DOCUMENTS

| | | | |
|---|---|---|---|
| 5,812,307 A * | 9/1998 | Naganuma | 359/341.1 |
| 6,011,645 A * | 1/2000 | Hong | 359/337.5 |
| 6,611,370 B2 | 8/2003 | Namiki et al. | |
| 6,618,521 B2 * | 9/2003 | Koshi | 385/24 |
| 6,680,960 B2 * | 1/2004 | Yoshida et al. | 372/45 |
| 6,825,972 B2 | 11/2004 | Emori et al. | |
| 6,830,185 B2 * | 12/2004 | Tsikos et al. | 235/462.01 |
| 6,882,468 B2 | 4/2005 | Emori et al. | |
| 2004/0032641 A1 | 2/2004 | Namiki et al. | |

* cited by examiner

Primary Examiner—Karl D. Frech
(74) Attorney, Agent, or Firm—Oblon, Spivak, McClelland, Maier & Neustadt, P.C.

(57) ABSTRACT

A pump light source for Raman amplification. The pump light source includes a fixed module with at least one laser diode module, an electronic device for driving and controlling the laser diode module and a photodiode for monitoring optical output in the at least one laser diode. The pump light source also includes an additional module which contains a prescribed number of module cards. Each of the module cards are removably connected to the fixed module.

9 Claims, 4 Drawing Sheets

PUMP LIGHT SOURCE FOR RAMAN AMPLIFICATION

FIELD OF THE INVENTION

The present invention relates to a flexible and high output light source, particularly a pump light source for Raman amplification which can upgrade a gain bandwidth of signal and mount a laser diode module having a pump wavelength corresponding to a required signal bandwidth.

RELATED ART

Laser diode modules have commonly been used as a signal light source of optical fiber communication, particularly trunk line system and CATV or an pump light source of a fiber amplifier. In such laser diode modules, in order to implement high output and stable operation, a Peltier element is incorporated and optical components such as a laser diode chip, a photodiode chip or a lens and electrical components such as a thermistor element, an inductor or a resistor are placed on a metal substrate mounted above the Peltier element.

A Raman amplifier which uses the laser diode module and utilizes a Raman effect has been known. The Raman amplifier has an advantage that a band thereof is wide. More specifically, since a gain is basically determined by a wavelength of pump light, the use thereof can be made in wide regions.

There is a Raman amplifier module on which laser diode modules of pump wavelengths corresponding to all the signal bandwidths are mounted. In a conventional Raman amplifier module, the Raman amplifier module with laser diode modules of pump wavelengths corresponding to all the signal bandwidths mounted is previously manufactured and the laser diode modules of the pump wavelengths corresponding to the signal bandwidths which are not used are not driven and only the laser diode modules of the pump wavelengths corresponding to the signal bandwidths which are used are driven.

As described above, in order to mount the laser diode modules of the pump wavelengths corresponding to all the signal bandwidths on the Raman amplifier, it is necessary to place plural laser diode modules of high output at high density.

As described above, there is the following problem in the conventional Raman amplifier module in which the Raman amplifier module with the laser diode modules of the pump wavelengths corresponding to all the signal bandwidths mounted is previously manufactured and the laser diode modules of the pump wavelengths corresponding to the signal bandwidths which are not used are not driven and only the laser diode modules of the pump wavelengths corresponding to the signal bandwidths which are used are driven.

More specifically, in the case of manufacturing the Raman amplifier module with the laser diode modules of the pump wavelengths corresponding to all the signal bandwidths mounted, it is difficult to replace the laser diode modules when the replacement of the laser diode modules is required. Particularly, when a change in a center wavelength of pump occurred after the Raman amplifier module was incorporated into a system, it was difficult to handle the required change.

Further, in the case that a transmission capacity increases and a signal bandwidth for transmission widens, it was necessary to newly design and remanufacture a Raman amplifier module on which a laser diode module of a required pump wavelength is mounted and replace the Raman amplifier module incapable of handling the above situation by the thus manufactured new Raman amplifier and reinstall same.

In addition to the optical problem, there exists a problem relating to a heat dissipation. More specifically, when individual laser diode modules come to have further higher output and the heat generated in accordance with the high-dense arrangement of the higher output laser diode modules is not properly treated, there is a problem that functions of the laser diode modules are damaged.

SUMMARY OF THE INVENTION

One embodiment of a pump light source for Raman amplification of the present invention is a pump light source for Raman amplification, comprising: a fixed module on which at least one laser diode module, an electronic device for driving and controlling the laser diode module and a photodiode for monitoring optical output in the laser diode module are mounted; and an additional module comprising a prescribed number of module cards, each of said module card being removably connected to said fixed module and mounting thereon at least one laser diode module.

DETAILED DESCRIPTION

Embodiments of a pump light source for Raman amplification of the present invention will be described in detail with reference to the drawings. One object of the present invention is to provide a pump light source for Raman Amplification which can handle a change in a bandwidth necessitating a gain and can mount a laser diode module of a pump wavelength corresponding to a required signal bandwidth and has high flexibility in the case that a transmission capacity increases and a signal bandwidth widens.

The present inventors have intensively studied to solve the conventional problems described above. As a result, it was found that in stead of previously manufacture a Raman amplifier module for mounting all the laser diode modules of pump wavelengths corresponding to all the signal bandwidths, by separately preparing a fixed module on which a laser diode module of a necessary minimum of pump wavelength is mounted and a card type additional module removably attached to the fixed module on which a laser diode module of a required pump wavelength as necessary is mounted, and by combining the fixed module with the additional module, changes in a center wavelength of pump, changes in a gain band and widening of the gain band can be flexibly handled.

Further, it was found that by using a heat sink with fins in which a heat pipe is connected to the fins as a heat sink for cooling the laser diode module, heat dissipating properties are further improved to have an excellent heat dissipating capability, thus a heat sink may be made compact, accordingly, a pump light source for Raman amplification with excellent optical property can be obtained.

The present invention was made based on the above study results.

A pump light source for Raman amplification of the present invention comprises a fixed module on which at least one laser diode module, an electronic device for driving and controlling the laser diode module and a photodiode for monitoring optical output in the laser diode module are mounted, and an additional module comprising a prescribed number of module cards, each of the module card being removably connected to the fixed module and mounting thereon at least one laser diode module.

A pump light source for Raman amplification of the present invention may further comprise an optical passive component module arranged between the fixed module and the additional module, including optical passive components such as a pump/signal combining device for combining pump light and signal light, a pump combining device for combining pump light from the laser diode module, an isolator and an optical connector.

Figure 1:
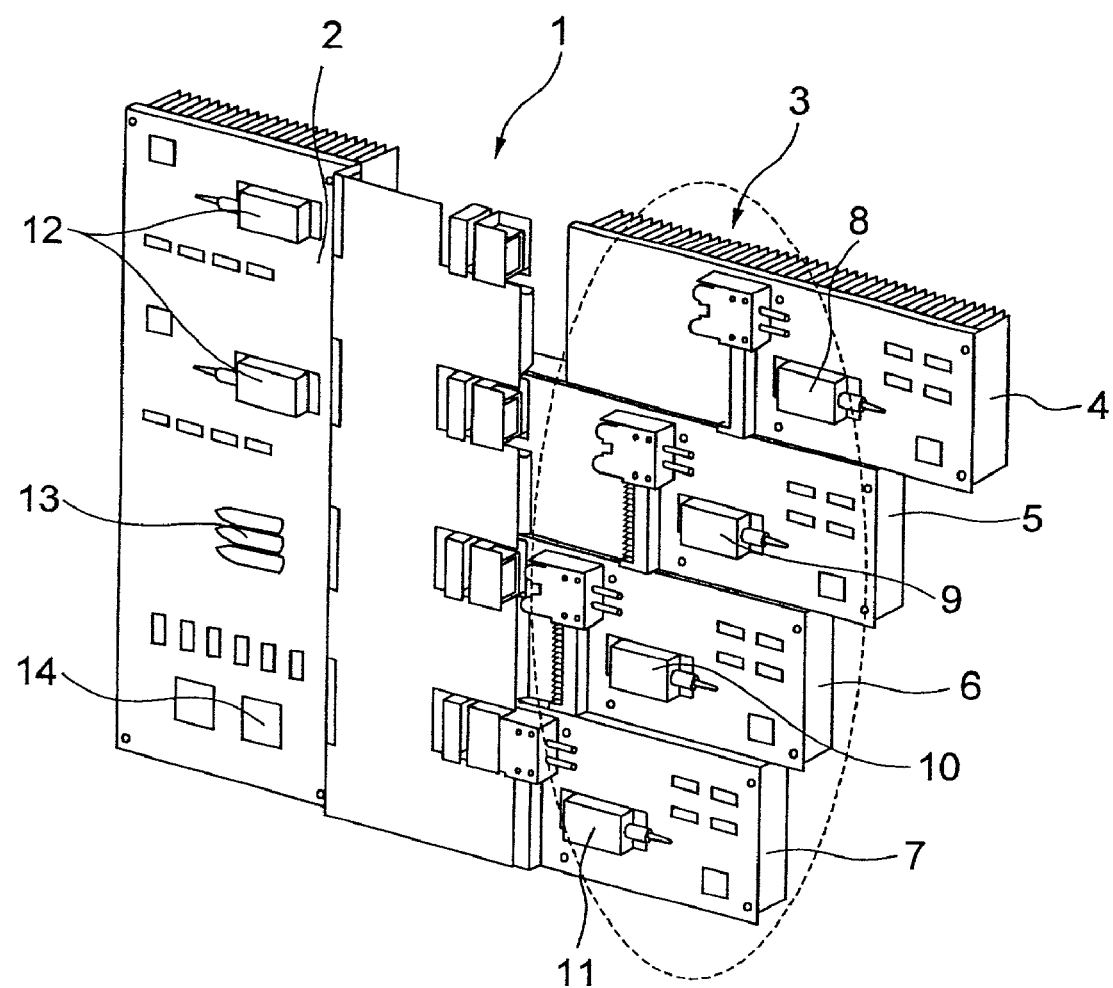
FIG. 1 is a view showing one embodiment of a pump light source for Raman amplification of the present invention.
Figure 2:
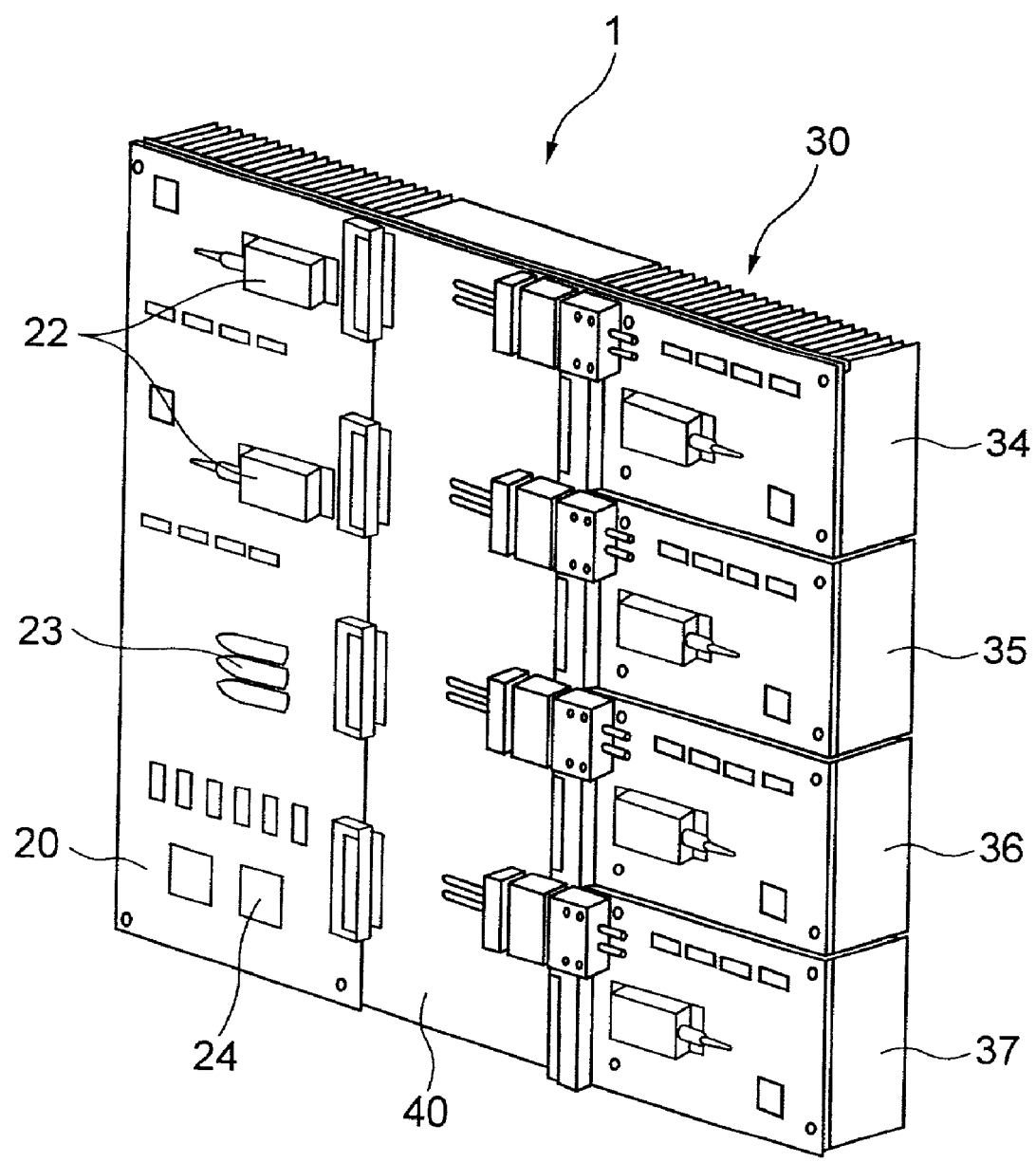
FIG. 2 is a view showing another embodiment of a pump light source for Raman amplification of the present invention.

FIG. 1 is a view showing one embodiment of a pump light source for Raman amplification of the present invention. An pump light source 1 for Raman of the present invention of the embodiment shown in FIG. 1 is a pump light source for Raman amplification comprising one fixed module 2 on which a laser diode module 12, an electronic device (for example, CPU) 14 for driving and controlling the laser diode module 12 and a photodiode 13 for monitoring optical output in the laser diode module 12 are mounted, and an additional module 3 including four module cards 4, 5, 6, 7 which are removably connected to the fixed module 2 and laser diode modules 8, 9, 10, 11 are mounted. More specifically, as required, the module cards can be added to the fixed module. The module cards can be freely attached to and removed from the fixed module. The module card may be called as a single laser driver card. FIG. 2 is a view showing another embodiment of a pump light source for Raman amplification of the present invention. An pump light source 10 for Raman of the present invention of the embodiment shown in FIG. 2 comprises a fixed module 20, an additional module 30, and an optical passive component module 40 including optical passive components such as a wave combining device for combining pump light from the laser diode module, an isolator and an optical connector, which is arranged between the fixed module 20 and the additional module 30.

The module card of the additional module described above includes an electronic device for driving and controlling the laser diode module, a heat sink for cooling the laser diode module, an electrical connector for communication and power supply, and a connector for optical connection. Further, in the pump light source for Raman of the present invention, automatic current control (ACC), Automatic Power Control (APC) and/or automatic temperature control of the laser diode modules in the module cards is performed independently in each of the module cards.

Further, in another embodiment of the the pump light source for Raman of the present invention, the fixed module provides functions of driving and controlling plural laser diode modules while only laser diode modules are mounted in the module cards of the additional module, thus, automatic current control (ACC), Automatic Power Control (APC) and/or automatic temperature control of the laser diode modules in the module cards may be performed all together in the fixed module.

Figure 3:
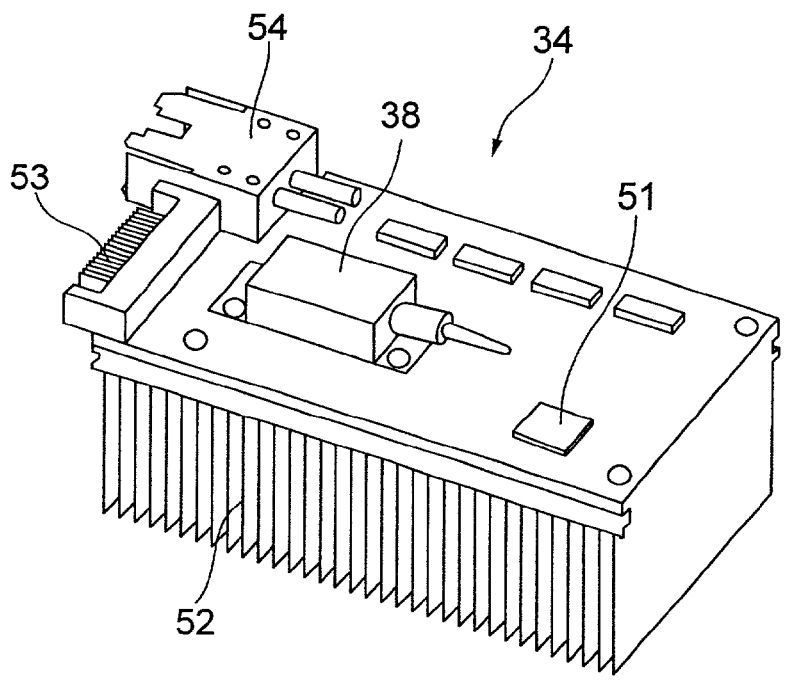
FIG. 3 is a view showing a module card of one embodiment of an additional module in the pump light source for Raman of the present invention.

FIG. 3 is a view showing a module card of one embodiment of the additional module in the pump light source for Raman of the present invention. The module card of this embodiment corresponds to the module card in the pump light source for Raman shown in FIG. 2. As shown in FIG. 3, a module card 34 comprises an electronic device (CPU) 51 for driving and controlling a laser diode module 38, a heat sink 52 for cooling the laser diode module 38, an electrical connector 53 for communication and power supply, and a connector 54 for optical connection.

Figure 4:
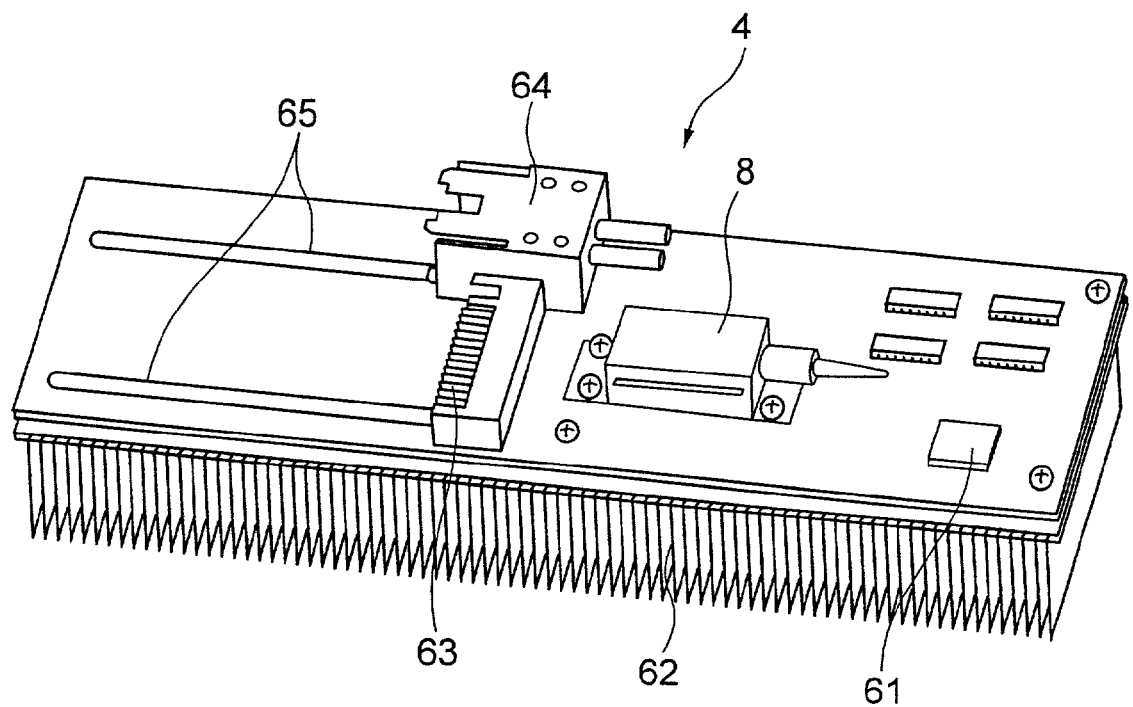
FIG. 4 is a view showing a module card of another embodiment of an additional module in the pump light source for Raman of the present invention.

FIG. 4 is a view showing a module card of another embodiment of the additional module in the pump light source for Raman of the present invention. The module card of this embodiment corresponds to the module card in the pump light source for Raman shown in FIG. 1. As shown in FIG. 4, a module card 4 comprises an electronic device (CPU) 61 for driving and controlling a laser diode module 8, a heat sink 62 for cooling the laser diode module 8, an electrical connector 63 for communication and power supply, and a connector 64 for optical connection. The heat sink 62 includes heat dissipating fins and heat pipes 65 connected to the heat dissipating fins. Heat from the laser diode module is dissipated by the heat dissipating fins in contact with the laser diode module, and at the same time, is transferred to a predetermined position and dissipated by the heat dissipating fins attached to the heat pipes.

Figure 5:
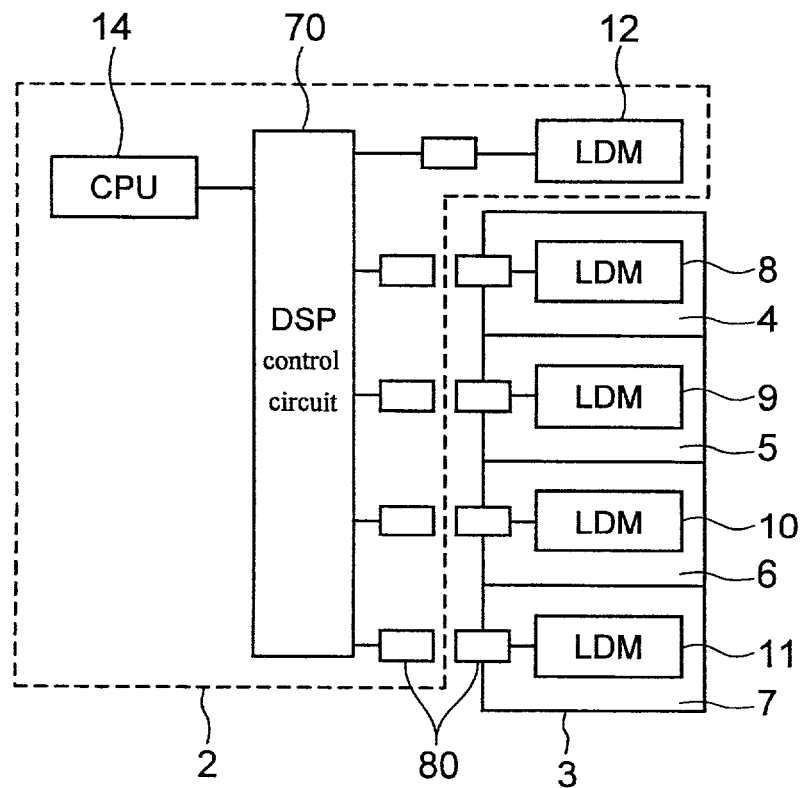
FIG. 5 is a conceptual system diagram of the pump light source for Raman of the present invention.

FIG. 5 is one conceptual system diagram of the pump light source for Raman of the present invention. As shown in FIG. 5, a fixed module 2 provides functions of driving and controlling plural laser diode modules, while only laser diode modules 8, 9, 10, 11 are mounted in module cards 4, 5, 6, 7 of an additional module 3. In a system shown in FIG. 5, in the fixed module, automatic current control (ACC), Automatic Power Control (APC) and/or automatic temperature control of the laser diode modules in the module cards 4, 5, 6, 7 is performed all together by a DSP (digital signal processor) control circuit 70 in the fixed module 2.

Figure 6:
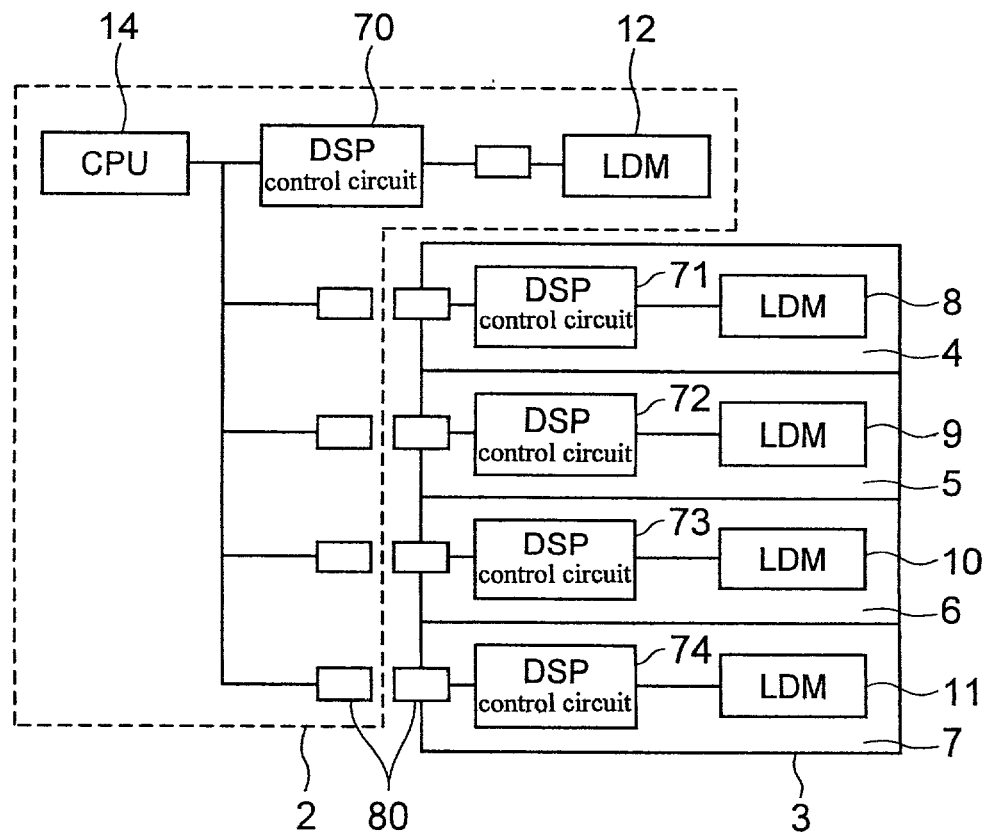
FIG. 6 is another conceptual system diagram of the pump light source for Raman of the present invention.

FIG. 6 is another conceptual system diagram of the pump light source for Raman of the present invention. In FIG. 6, automatic current control (ACC), Automatic Power Control (APC) and/or automatic temperature control of the laser diode modules in the module cards 4, 5, 6, 7 is performed independently by DSP (digital signal processor) control circuits 71, 72, 73, 74 in each of the module cards. In addition, automatic current control (ACC), Automatic Power Control (APC) and/or automatic temperature control of the laser diode module 12 in the fixed module 2 is performed independently by DSP (digital signal processor) control circuit 70 in the fixed module 2.

The pump light source for Raman of the present invention providing a system shown in FIG. 6 will be described below in further detail.

As shown in FIG. 2, the pump light source for Raman of the present invention comprises a fixed module 20 located in the side of a back panel of a system rack when the module is installed in the system rack, an additional module 30 located in the side of a front panel of the system rack, and an optical passive component tray 40 in which a wave combining device such as a WDM (wavelength division multiplexing) coupler and an isolator is arranged, which is located between the fixed module and the additional module.

As shown in FIG. 6, a circuit 70 such as a DSP chip necessary to drive and control a laser diode module 12, a photodiode for monitoring optical output and a CPU 14 for driving and controlling an amplifier module are mounted in a fixed module 2.

The number of laser diode modules mounted in the fixed module varies depending on a band for amplifying an optical signal at the time of startup and a necessary gain. In the embodiment shown in FIG. 2, two laser diode modules 22 are mounted in the fixed module and thereby, startup is performed.

As shown in FIG. 6, an additional module includes a first module card 4, a second module card 5, a third module card 6 and a fourth module card 7. In the module cards 4, 5, 6, 7, as shown in FIG. 3, one laser diode module is mounted on a footprint with 40 mm by 60 mm, and a circuit such as a DSP chip necessary to drive and control the laser diode module is mounted. Further, a heat sink for cooling the laser diode module is attached to the module card, and an electrical connector for communication and power supply and a connector for optical connection are attached together.

As shown in FIG. 6, a DSP control circuit is mounted in each of the module cards, and automatic current control (ACC), Automatic Power Control (APC) and automatic temperature control of the laser diode module is performed independently in each of the module cards. Electrical and optical connections between the module cards and the fixed module are made by electrical connectors for communication and power supply as well as connectors 80 for optical connection. In the case of the above-mentioned control, a setting value of current or optical output is sent from the CPU mounted in the fixed module to the DSP control circuits of the respective module cards. More specifically, as shown in FIG. 6, the laser diode module mounted in the fixed module corresponds to the laser diode modules mounted in the respective module cards, and the respective laser diode modules are controlled by the CPU through each of the DSP control circuit.

In FIG. 3, a heat sink comprising the base plate and plate fins fixed thereto is used as a heat sink, however, fins such as pin fins may be used in the heat sink. When a height of the heat dissipating fins is intended to be small, it is possible to employ the heat pipe as shown in FIG. 4 so as to transfer most of the heat to a specific location and to be dissipated there, thus while the height of the heat dissipating fins are made small, the heat of the laser diode module can be efficiently cooled.

Although an MU connector is used as an optical connector, other optical connectors such as BLC may be used.

A pump wavelength of the laser diode module mounted in a single laser driver card is determined so that a predetermined Raman gain can be obtained in combination with the fixed module.

Incidentally, in the addition of the pump light in a transmission system, it is preferable to be performed by hot-swapping through software control or hot-swapping through manual control such as a switch.

Next, the pump light source for Raman of the present invention providing a system shown in FIG. 5 will be described in further detail.

The pump light source for Raman of the present invention comprises a fixed module located in the side of a back panel of a system rack when the module is inserted into the system rack, an additional module located in the side of a front panel of the system rack, and an optical passive component, for placing a wave combining device such as a WDM (wavelength division multiplexing) coupler and an isolator, the optical passive component being located between the fixed module and the additional module. In this embodiment, plural laser diode modules including the laser diode modules mounted on the additional module can be driven and controlled by a CPU and a DSP mounted in the fixed module.

As shown in FIG. 5, a laser diode module 12 mounted in the fixed module, a DSP control circuit 70 necessary to drive and control laser diodes 8, 9, 10, 11 mounted in each module card 4, 5, 6, 7, a photodiode for monitoring optical output, a CPU 14 for driving and controlling an amplifier module, etc. are mounted in a fixed module 2.

The number of laser diode modules mounted in the fixed module varies depending on a band for amplifying an optical signal at the time of startup and a necessary gain.

As shown in FIG. 5, an additional module includes a first module card 4, a second module card 5, a third module card 6 and a fourth module card 7. One laser diode module is mounted in the respective module cards 4, 5, 6, 7. Further, a heat sink for cooling the laser diode module is attached to the module card, and an electrical connector for communication and power supply and a connector for optical connection are attached together to the module card.

As shown in FIG. 5, the fixed module 2 provides functions of driving and controlling plural laser diode modules and only laser diode modules 8, 9, 10, 11 are mounted in module cards 4, 5, 6, 7 of an additional module 3. In the system shown in FIG. 5, automatic current control (ACC), Automatic Power Control (APC) and/or automatic temperature control of the laser diode modules in the module cards is performed all together by the DSP (digital signal processor) control circuit 70 in the fixed module.

Electrical and optical connections between the module cards and the fixed module are made by electrical connectors for communication and power supply as well as connectors 80 for optical connection. In the case of the above-mentioned control, a setting value of current or optical output is sent from the CPU mounted in the fixed module to the DSP control circuit 70 mounted in the fixed module. More specifically, as shown in FIG. 5, the laser diode module mounted in each of the module card is controlled by the CPU mounted in the fixed module through the DSP control circuit.

Incidentally, a heat pipe will be described. In the heat absorbing side of the heat pipe, working fluid evaporates by the heat which is transferred and traveled through the material of a container for forming the heat pipe, and the vaporized working fluid moves toward the heat dissipating side of the heat pipe. In the heat dissipating side, the vaporized working fluid is cooled and returns back to a liquid phase state. The working fluid returning to the liquid phase moves (flows back) to the heat absorbing side again. The heat transfer is thus performed by phase transformation or movement of the working fluid.

The flowing back of the working fluid to the heat absorbing side is performed by gravity or a capillary action. In the case of a gravity type heat pipe, the working fluid flows back from the heat dissipating side to the heat absorbing side by placing the heat absorbing side lower than the heat dissipating side. In the case of a heat pipe for flowing back the working fluid from the heat dissipating side to the heat absorbing side by the capillary action, the working fluid flows back from the heat dissipating side to the heat absorbing side by means of the capillary action through grooves or a wick. The grooves are provided in the inner wall of the cavity of the container or the wick such as a metal mesh or a porous material is inserted into the cavity of the container.

In the heat pipe, thus, a large mount of heat is transferred by the phase transformation and the movement of the working fluid received within the hermetically sealed container of the heat pipe. Therefore, the heat of the laser diode modules can be largely and rapidly moved by using the heat pipe, so that the laser diode modules come to have higher output and the heat generated from the highly densely arranged laser diode modules can be effectively removed.

As described above, according to the present invention, the addition of the laser diode modules for excitation can be facilitated. Further, a Raman amplifier module with a low initial manufacturing cost can be provided. Furthermore, a compact Raman amplifier with control and driving circuits for controlling and driving the laser diode modules can be provided.

As described above, according to the present invention, there can be provided a pump light source for Raman amplification including a fixed module with a laser diode module of a necessary minimum of pump wavelength mounted and a card type additional module for removably added on which a laser diode module of a required pump wavelength as necessary mounted, by separately preparing the fixed module and the card type additional modules and combining the fixed module and the card type additional modules, thereby changes in a center wavelength of pump and a gain band and widening of the gain band can be flexibly handled.

What is claimed is:

1. A pump light source for Raman amplification, comprising:
   a fixed module on which at least one laser diode module of a pump wavelength, an electronic device for driving and controlling the laser diode module and a photodiode for monitoring optical output in the laser diode module are mounted; and
   an additional module comprising a prescribed number of module cards, each of said module card being additionally and/or removably connected to said fixed module and mounting thereon at least one laser diode module of a pump wavelength different from that of said laser diode module of said fixed module.

2. A pump light source for Raman amplification as claimed in claim 1, further comprising an optical passive component module arranged between the fixed module and the additional module, including optical passive components such as a wave combining device for combining pump light from the laser diode module, an isolator and an optical connector.

3. A pump light source for Raman amplification as claimed in claim 1, wherein said module card of said additional module includes an electronic device for driving and controlling the laser diode module, a heat sink for cooling the laser diode module, an electrical connector for communication and power supply, and a connector for optical connection.

4. A pump light source for Raman amplification as claimed in claim 3, wherein automatic current control (ACC), Automatic Power Control (APC) and/or automatic temperature control of the laser diode modules in the module cards is performed independently in each of the module cards.

5. A pump light source for Raman amplification as claimed in claim 4, wherein a setting value of current and/or optical output is sent from the electronic device comprising a CPU mounted in the fixed module to the electronic device comprising a DSP mounted in the module card.

6. A pump light source for Raman amplification as claimed in claim 1, wherein said fixed module provides functions of driving and controlling plural laser diode modules while only the laser diode modules are mounted in the module cards of said additional module, and automatic current control (ACC), Automatic Power Control (APC) and/or automatic temperature control of the laser diode modules in said module cards is performed all together in said fixed module.

7. A pump light source for Raman amplification as claimed in any one of claims 1–6, wherein connections between said fixed module and said module cards are made by hot-swapping through automatic control or hot-swapping through manual control.

8. A pump light source for Raman amplification as claimed in claim 1, wherein said fixed module comprises a monitor card for mounting the photodiode, a CPU card for mounting the electronic device including a CPU, and a laser diode module card for mounting the laser diode module.

9. A pump light source for Raman amplification as claimed in any one of claims 1–6 and 8, wherein a pump wavelength of the laser diode module in said module card is determined so that a predetermined Raman gain can be obtained in combination with a pump wavelength of the laser diode module in said fixed module.

* * * * *